(12) United States Patent
Hirai et al.

(10) Patent No.: US 6,288,619 B1
(45) Date of Patent: Sep. 11, 2001

(54) BIAS CIRCUIT FOR USE IN QUADRATURE MODULATOR

(75) Inventors: Yukinori Hirai, Atsugi; Yasuyuki Honma, Chofu, both of (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/578,465

(22) Filed: May 25, 2000

(30) Foreign Application Priority Data

May 28, 1999 (JP) .................................................. 11-150265

(51) Int. Cl.[7] .............................. H03C 3/00; H04L 27/20
(52) U.S. Cl. ............................................. 332/103; 375/308
(58) Field of Search ..................................... 332/103–105; 375/279–284, 308

(56) References Cited

U.S. PATENT DOCUMENTS 5,428,643 * 6/1995 Razzell .................................. 375/308

* cited by examiner

Primary Examiner—David Mis
(74) Attorney, Agent, or Firm—Frishauf, Holtz, Goodman, Langer & Chick, P.C.

(57) ABSTRACT

In a bias circuit for use in a quadrature modular, the bias circuit comprises a bias stabilizing resister having a resistance value which is substantially equal to as impedance value of an output impedance of a low pass filter through which an input signal is supplied to the bais circuit. The bias stabilizing resistor is disposed between first and second nodes for producing a noninverted signal and an inverted signal, respectively. The input signal is supplied to the first node through an input capacitor. A ground potential is supplied to the second node through a ground capacitor. The bias circuit comprises a first resistor between a power supply terminal and the first node, a second resistor between a power supply terminal and the first node, a third resistor between the first node a ground terminal, and a forth resistor between the second node and the ground terminal.

4 Claims, 3 Drawing Sheets

BIAS CIRCUIT FOR USE IN QUADRATURE MODULATOR

BACKGROUND OF THE INVENTION

This invention relates to quadrature modulator and, in particular, to a bias circuit for use in the quadrature modulator.

As the manner known in the art, a quadrature modulator is used as a digital modulator in a phase shift keying such as a quadrature phase shift keying (QPSK). The quadrature modulator is supplied with an in-phase input signal and a quadrature input signal from a digital transmuting part. The quadrature input signal has a phase which is different from that of the in-phase input signal by 90 degrees or $\pi$ radlan. The quadrature modulator is also supplied with a local signal having a predetermined frequency from a local oscillator. In the manner known in the art, the quadrature modulator modulates the in-phase input signal and the quadrature input signal using the local signal to produce a modulated signal.

In the manner which will later be described in conjunction with FIG. 1, the quadrature modulator comprises first and second bias circuits and a phase modulating circuit The first bias circuit is supplied with the in-phase input signal as an input signal while the second bias circuit is supplied with the quadrature input signal as an input signal.

In the manner which will later be described in conjunction with FIGS. 2 through 4, a conventional bias circuit comprises an input capacitor, first through fourth resistors, a ground capacitor, a bias stabilizing resistor, and a matching load resistor. Each of the first and the second resistors has an end connected to a power supply terminal. The third resistor has, as a first node, an end connected to another end of the first resistor. The fourth resistor has, as a second node, an end connected to another end of the second resistor. Each of the third and the fourth resistors is grounded. The bias stabilizing resistor is connected between the first and the second nodes to make first and second DC bias voltages at the first and the second nodes substantially equal. The first through the fourth resistors have the same and high resistance.

On the other hand, the input signal is supplied to the bias circuit through a low pass filter for limiting a band of the input signal. The low pass filter has a low output impedance while the bias circuit has a high input impedance. In order to make the bias circuit and the low pass filter impedance-matching, the matching load resistor is connected to an output terminal of the low pass filter and a ground terminal.

As described above, the conventional bias circuit comprises the bias stabilizing resistor and the matching load resistor and it results in increasing the number of the resistors.

SUMMARY OF THE INVENTION

It is therefore an object of the present invention to provide a bias circuit for use in a quadrature modulator, that is capable of decreasing the number of resistors constituting the bias circuit Other objects of this invention will become clear as the description proceeds.

On describing the gist of this invention, it is possible to be understood that a bias circuit is for use in a quadrature modulator. The bias circuit has an input terminal supplied with an input signal through a low pass filter having an output impedance. The bias circuit has first and second nodes for producing a noninverted signal and an inverted signal, respectively. The bias circuit comprises an input capacitor disposed between Me input terminal and the first node, a first resistor disposed between a power supply terminal and the first node, a second resistor disposed between the power supply terminal and the second node, a third resistor disposed between the first node and a ground terminal, a fourth resistor disposed between the second node and the ground terminal, a ground capacitor disposed between the second node and the ground terminal, and a bias stabilizing resistor connected between the first and the second nodes. According to an aspect of this invention, in the above-understood bias circuit, the bias stabilizing resistor has a resistance value which is substantially equal to an impedance value of the output impedance of the low pass filter.

DESCRIPTION OF THE PREFERRED EMBODIMENT

Figure 1:
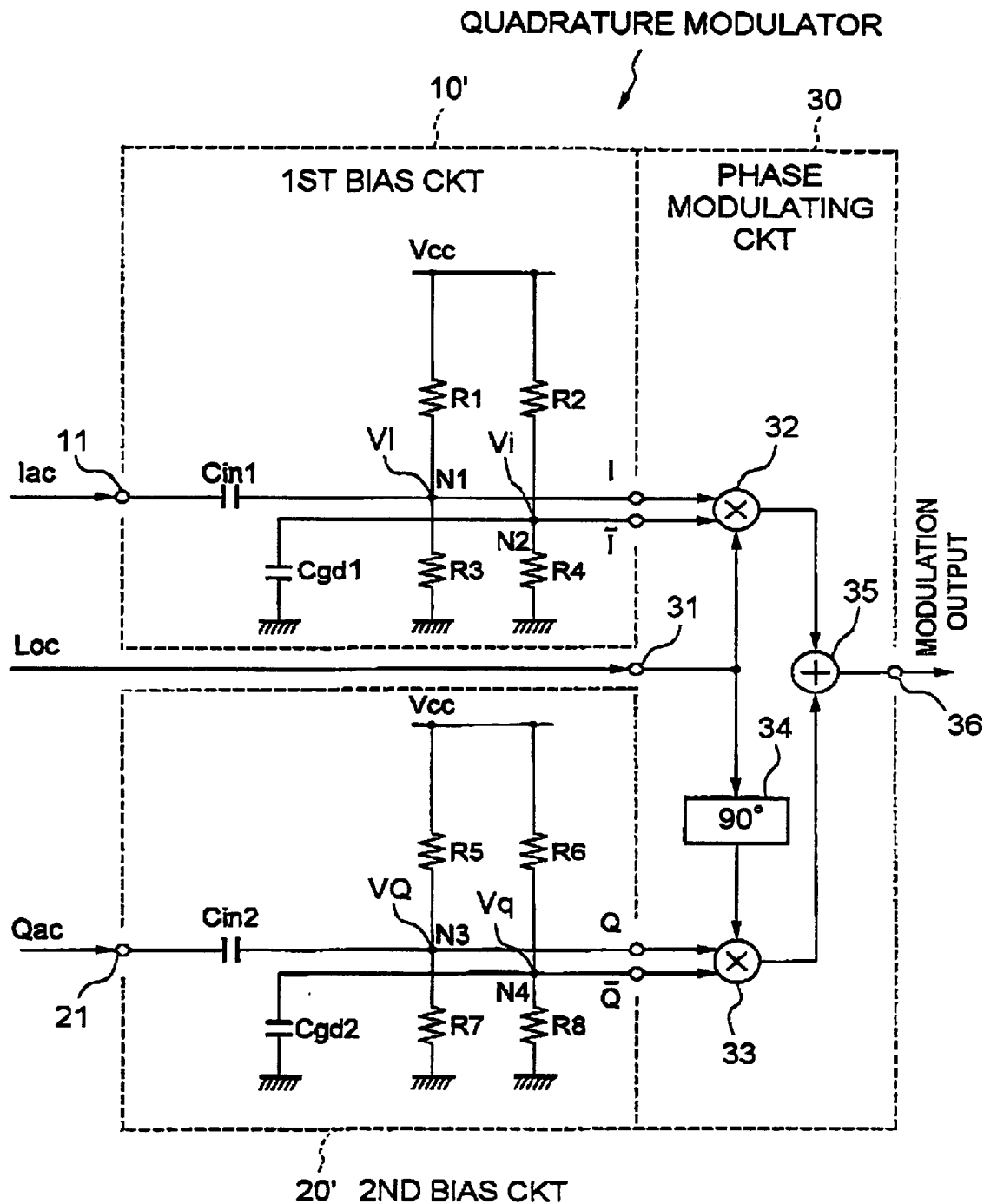
FIG. 1 is a circuit diagram showing a conventional quadrature modulator.

FIG. 1, conventional quadrature modulator will be described at first in order to facilitate an understanding of the present invention. The illustrated quadrature modulator is widely used as a digital modulator in a quadrature phase shift keying (QPSK).

The quadrature modulator is supplied with an in-phase input signal lac and a quadrature input signal Qac from a digital transmitting part (not shown). The in-phase input signal Iac and the quadrature input signal Qac have a phase difference of 90 degrees each other. The quadrature modulator is also supplied with a local signal Loc having a predetermined frequency from a local oscillator (hot shown). The quadrature modulator modulates the in-phase input signal Iac and the quadrature input signal Qac using the local signal Loc to produce a modulated signal in the manner which will later be described.

The quadrature modulator comprises a first bias circuit 10' for the in-phase input signal Iac, a second bias circuit 20' for the quadrature input signal Qac, and a phase modulating circuit 30.

The first bias circuit 10' has a first input terminal 11 supplied with the in-phase input signal lac as an input signal while the second bias circuit 20' has a second input terminal 21 supplied with the quadrature input signal Qac as input signal. The phase modulating circuit has a third input terminal 31 supplied with the local signal Loc.

The first bias circuit 10' comprises a first input capacitor Cin1, first through fourth resistors R1, R2, R3, and R4, and a first ground capacitor Cgd1. The first capacitor Cin1 is connected between the first input terminal 11 and a first node N1. The first resistor R1 has an end connected to a power supply terminal supplied with a power supply voltage Vcc and another end connected to the first node N1. The second resistor R2 has an end connected to the power supply terminal and another end connected to a second node N2. The third resistor R3 has an end connected to the first node N1 and another end connected to a ground terminal having a ground potential. The fourth resistor R4 has an end connected to the second node N2 and another end connected to the ground terminal. The first ground capacitor Cgd1 is connected between the second node N2 and the ground terminal.

Likewise, the second bias circuit 20' comprises a second input capacitor Cin2, fifth through eighth resistors R5, R6, R7, and R8, and a second ground capacitor Cgd2. The second capacitor Cin2 is connected between the second input terminal 21 and a third node N3. The fifth R5 has an end connected to the power supply terminal and another end connected to the third node N3. The sixth resistor R6 has an end connected to the power supply terminal and another end connected to a fourth node N4. The seventh resistor R7 has an end connected to the third node N3 and another end connected to the ground terminal. The eight resistor R8 has an end connected to the fourth node N4 and another end connected to the ground terminal. The second ground capacitor cgd2 is connected between the fourth node N4 and the ground terminal.

At any rate, a bias circuit generally comprises an input capacitor like Cin1 or Cin2, a first resistor like R1 or R5, a second resistor like R2 or R6, a third resistor like R3 or R7, a fourth resistor like R4 or R8, and ground capacitor like Cgd1 or Cgd2.

In the manner which will later become clear, the first bias circuit 10' produces a noninverted in-phase signal I and an inverted in-phase signal/I while the second bias circuit 20' produces a noninverted quadrature signal Q and an inverted quadrature signal/Q.

The phase modulating circuit 30 comprises first and second multipliers 32 and 33, a 90 degrees phase shifter 33, and an adder 35. The first multiplier 32 is connected to the third input terminal 31 and are supplied with the noninverted in-phase signal I and the inverted in-phase signal/I. The 90 degrees phase shifter 34 is connected the the third input terminal 31. The second multiplier 33 is connected to the 90 degrees phase shifter 34 and are supplied with the noninverted quadrature signal Q and the inverted quadrature signal/Q. The adder 35 in connected to the first and the second multiplier 32 and 33 and is connected to a modulation output terminal 36.

Description will proceed to operation of the conventional quadrature modulator illustrated in FIG. 1.

In the first bias circuit 10', the first node N1 has a first DC bias voltage $V_I$ obtained by dividing the power supply voltage Vcc using a first resistor potential divider consisting of the first and the third resistors R1 and R3. The in-phase input signal Iac is supplied to the first node N1 via the first input capacitor Cin1 to obtain the noninverted in-phase signal I which is biased by the first DC bias voltage $V_I$. Similarly, the second node N2 has a second DC bias voltage $V_i$ obtained by dividing the power supply voltage Vcc using a second resistor potential divider consisting of the second and the fourth resistors R2 and R4. The ground potential is supplied to the second node N2 via the first ground capacitor Cgd1 to obtain the inverted in-phase signal/I which is biased by the second DC bias voltage Vi. The noninverted in-phase signal I and the inverted in-phase signal/I are supplied to the first multiplier 32 of the phase modulating circuit 30.

in the second bias circuit 20', the third node N3 has a third DC bias voltage $V_Q$ obtained by dividing the power supply voltage Vcc using a third resistor potential divider consisting of the fifth and the seventh resistors R5 and R7. The quadrature input signal Qac is supplied to the third node N3 via the second input capacitor Cin2 to obtain the noninverted quadrature signal a which is biased by the third DC bias voltage $V_Q$. Likewise, the fourth node N4 has a fourth DC bias voltage $V_q$ obtained by dividing the power supply voltage Vcc using a fourth resistor potential divider consisting of the sixth and the eighth resistors R6 and RS. The ground potential is supplied to the fourth node N4 via the second ground capacitor Cgd2 to obtained the inverted quadrature signal/Q which is biased by the fourth DC bias voltage $V_q$. The noninverted quadrature signal Q and the inverted quadrature signal/Q are supplied to the second multiplier 33 of the phase modulating circuit 30.

In the phase modulating circuit 30, the first multiplier 32 modulates the noninverted in-phase signal I and the inverted in-phase signal/I using the local signal Loc to produce an in-phase modulated signal. The 90 degrees phase shifter 34 shifts a phase of the local signal Loc by 90 degress to produce a phase-shifted local signal supplied to the second multipiler 33. The second multiplier 33 modulates the noninverted quadrature signal Q and the inverted quadrature signal 10 using the phase-shifted local signal to produce a quadrature modulated signal. The adder 35 adds the in-phase modulated signal and the quadrature modulated signal to produce the modulated signal which is outputted by the modulation output terminal 38.

In the first bias circuit 10', It is necessary to make the first and the second DC bias voltage $V_I$ and $V_i$ equal to each other in addition, it is necessary for the second bias circuit 20' to make the third and the fourth DC bias voltage $V_Q$ and $V_q$ equal to each other. In other words, it is necessary to reduce a DC offset. This is because the DC offset has an adverse effect on modulation precision in the quadrature modulator. The DC offset normally is caused by variations in the resistors constituting the first and the second bias circuit 10' and 20'.

In order to have no effect on the modulation precision in the quadrature modulator, a bias stabilizing resistor is attached to the bias circuit in prior art. Although description will be made only about the bias circuit for the in-phase input signal Iac (the first bias circuit), the bias circuit for the quadrature input signal Qac (the second bias circuit) may also be applicable in similar structure.

Figure 2:
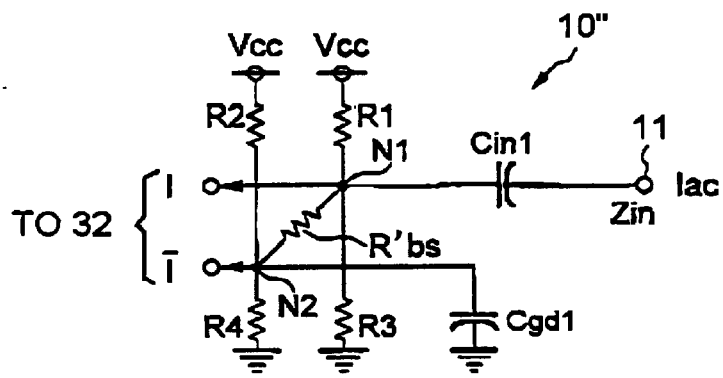
FIG. 2 is a circuit diagram showing a conventional bias circuit for use in the quadrature modulator illustrated in FIG. 1.

Turning to FIG. 2, the description will proceed to a conventional bias circuit 10" with the bias stabilizing resistor R'bs. In order to be substantially identical the first DC bias voltage $V_I$ with the second DC bias voltage $V_i$ or $V_I \approx V_i$, the bias stabilizing resistor R'bs is connected to the first node N1 and the second node N2. It is noted that the first through the fourth resistors R1 to R4 have the same and high resistance value.

On the other hand, each of the noninverted in-phase signal I, the inverted in-phase signal/I, the noninverted quadrature signal Q, and the inverted quadrature signal/Q is a band limited signal. For band limit, a low pass filter 40 Illustrated in FIG. 3 is used.

Figure 3:
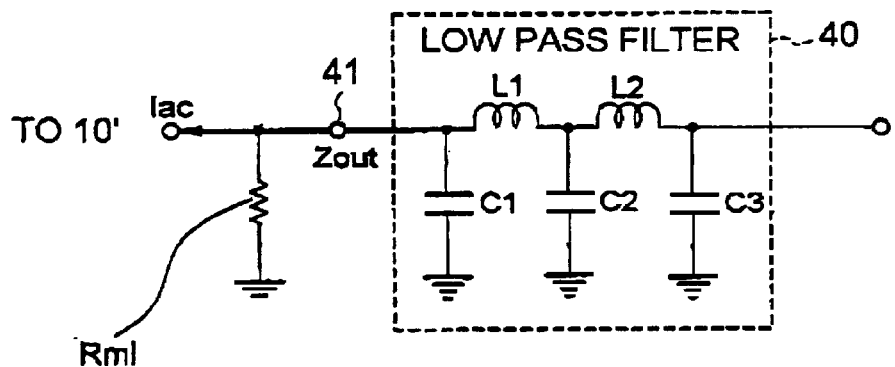
FIG. 3 is a circuit diagram showing a low pass filter which is disposed between a digital transmitting part and the bias circuit.

As shown in FIG. 3, the in-phase input signal Iac is supplied to the bias circuit 10" (the first bias circuit 10' illustrated in FIG. 1) through the low pass filter 40 from the digital transmitting part (not shown). The Illustrated low pass filter 40 comprises first through third capacitors C1 through C3 and first and second inductors L1 and L2. Although the low pass filter 40 has a low output impedance Zout, the bias circuit 10" has a high input impedance Zin. in other words, it is necessary to match the impedance of the low pass filter 40 because the quadrature modulator (the bias circuit) normally has the high input impedance.

For this purpose, in order to connect an output terminal 41 of the low pass filter 40 having the low output impedance Zout with the input terminal 11 of the bias circuit 10" having the high input impedance Zin, a matching load resistor Rml is disposed between the output terminal 41 of the low pass filter 40 (the input terminal 11 of the bias circuit 10")and the ground terminal. In addition, the matching load resistor Rml has a resistance value which is equal to an impedance value of the output impedance Zout of the low pass filter 40, namely, Rml=Zout.

Although the low pass filter 40 for the in-phase input signal Iac is Illustrated in FIG. 3, a low pass filter for the quadrature input signal Qac is similar structure in the low pass filter 40.

Figure 4:
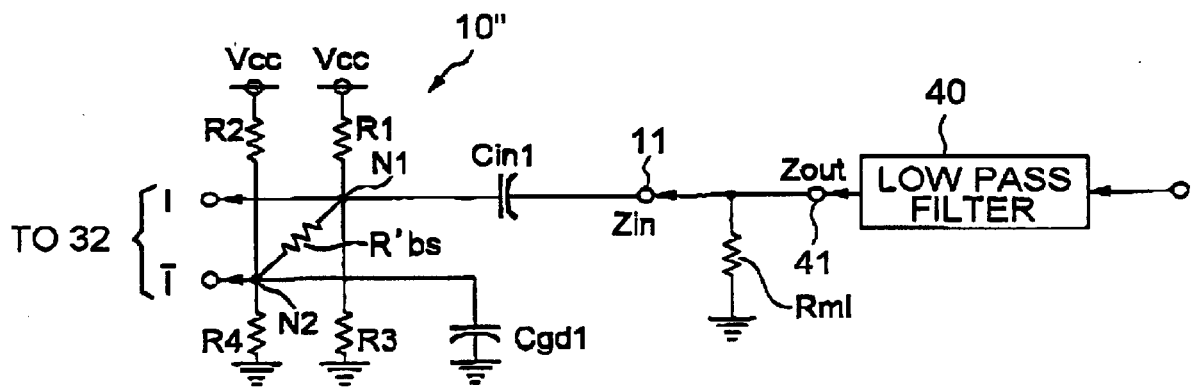
FIG. 4 is a circuit diagram showing a conventional bias circuit together with the low pass filter.

Ultimately, as shown in FIG. 4, the conventional bias circuit 10" must comprise the bias stabilizing resistor R'bs and the matching load resistor Rml at output side of the low pass filter 40, as mentioned in the preamble of the instant specification.

Figure 5:
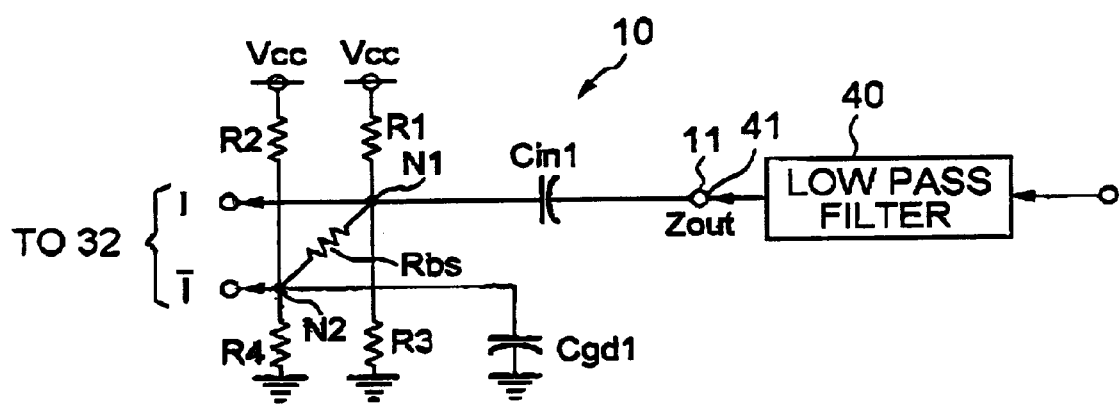
FIG. 5 is a circuit diagram showing a bias circuit according to an embodiment of this invention together with the low pass filter.

Referring to FIG. 5, the description will proceed to a bias circuit 10 according to an embodiment of this invention. FIG. 5 is a circuit diagram showing the bias circuit 10 with the low pass filer 40.

The illustrated bias circuit 10 is the first bias circuit for the in-phase input signal Iac. A bias circuit for the quadrature input signal Qac is similar in structure as the bias circuit 10.

The illustrated bias circuit 10 has a basic structure which is similar to the bias circuit 10" illustrated in FIG. 2. That is, the bias circuit 10 comprises the input capacitor Cin1, the first through the fourth resistors R1 to R4, the ground capacitor Cgd1, and a bias stabilizing resistor Rbs. Each of the first and the second resistors R1 and R2 has an end connected to the power supply terminal supplied to the power supply voltage Vcc. The first and the second resistors R1 and R2 have another ends which are connected to the first and the second nodes N1 and N2, respectively. The third and the fourth resistors R3 and R4 have ends connected to the first and the second nodes N1 and N2, respectively. Each of the third and the fourth resistors RS and R4 has another end connected to the ground terminal. The first node N1 is supplied with the input signal (the in-phase input signal Iac) through the low pass filter 40 and the input capacitor Cin1. In addition, the second node N2 is connected to the ground terminal through the ground capacitor Cgd1. The bias stabilizing resistor Rbs is connected between the first and the second nodes N1 and N2.

The bias circuit 10 is different from the conventional bias circuit 10" (FIGS. 2 and 4) as follows. That s, the bias stabilizing resistor Rbs has a resistance value which is substantially equal to an impedance value of the output impedance Zout of the low pass filter 40, namely, Rbs=Zout. In addition, the output terminal 41 of the low pass filter 40 is directly connected to the input terminal 11 of the bias circuit 10 without through anyone.

With this structure, the bias circuit 10 comprises the bias stabilizing resistor Rbs although the conventional bias circuit 100 comprises the bias stabilizing resistor R'bs and the matching load resistor Rml. Accordingly, it is possible to decrease the number of the resistors required in the bias circuit 10 and its peripheral circuit.

In the example being illustrated, each of the resistance value of the bias stabilizing resistor Rbs and the impedance value of the output impedance Zout of the low pass filter is equal to about 560 Ω. In addition, each of the first through the fourth resistors R1 to R4 constituting the bias circuit 10 has a resistance value which is equal to about 2.7 kΩ.

While this invention has thus far been described in conjunction with a preferred embodiment thereof, it will now be readily possible for those skilled in the art to put this invention into various other manners. For example, the above-mentioned resistors may have resistance values which are suitably selected as necessary.

What is claimed is:

1. A bias circuit for use in a quadrature modulator, said bias circuit having an input terminal supplied with an input signal through a low pass filter having an output impedance, said bias circuit having first and second nodes for producing a noninverted signal and an inverted signal, respectively, said bias circuit comprising:

an input capacitor disposed between the input terminal and the first node;

a first resistor disposed between a power supply terminal and the first node;

a second resistor disposed between the power supply terminal and the second node;

a third resistor disposed between the first node and a ground terminal;

a fourth resistor disposed between the second node and the ground terminal;

a ground capacitor disposed between the second node and the ground terminal; and a bias stabilizing resistor connected between the first and the second nodes, said bias stabilizing resistor having a resistance value which is substantially equal to an impedance value of the output impedance of said low pass filter.

2. A bias circuit as claimed in claim 1, wherein each of the resistance value of said bias stabilizing resistor and the impedance value of the output impedance of said low pass filter is equal to about 560 Ω and each of the first through the fourth resistors having a resistance value which is equal to about 2.7 k Ω.

3. A quadrature modulator supplied with an in-phase input signal and a quadrature input signal to produce a modulated signal, said quadrature modulator comprising:

a first bias circuit having a first input terminal supplied with the in-phase input signal through a first low pass filter having a first output impedance, said first bias circuit having first and second nodes for producing a noninverted in-phase signal and an inverted in-phase signal, respectively;

a second bias circuit having a second input terminal supplied with the quadrature input signal through a second low pass filter having a second output impedance, said second bias circuit having third and fourth nodes for producing a noninverted quadrature signal and an inverted quadrature signal, respectively; and a phase modulating circuit, connected to said first and said second bias circuit and supplied with a local signal, for modulating the noninverted in-phase signal, the inverted in-phase signal, the noninverted quadrature signal, and the inverted quadrature signal using the local signal to produce the modulated signal, said first bias circuit comprising:

a first input capacitor disposed between the first input terminal and the first node;

a first resistor disposed between a power supply terminal and the first node;

a second resistor disposed between the power supply terminal and the second node;

a third resistor disposed between the first node and a ground terminal;

a fourth resistor disposed between the second node and the ground terminal;

a first ground capacitor disposed between the second node and the ground terminal; and a first bias stabilizing resistor connected between the first and the second nodes, said first bias stabilizing resistor having a resistance value which is substantially equal to an impedance value of the first output impedance of said first low pass filter, said second bias circuit comprising:

a second input capacitor disposed between the second input terminal and the third node;

a fifth resistor disposed between a power supply terminal and the third node;

a sixth resistor disposed between the power supply terminal and the fourth node;

a seventh resistor disposed between the third node and the ground terminal;

a eighth resistor disposed between the fourth node and the ground terminal;

a second ground capacitor disposed between the fourth node and the ground terminal; and a second bias stabilizing resistor connected between the third and the fourth nodes, said second bias stabilizing resistor having a resistance value which is substantially equal to an impedance value of the second output impedance of said second low pass filter.

4. A quadrature modulator as claimed in claim 3, wherein each of the resistance value of said first and said second bias stabilizing resistors and the impedance value of the first and the second output impedances of said first and said second low pass filters is equal to about 560 $\Omega$ and each of the first through the eighth resistors having a resistance value which is equal to about 2.7 k$\Omega$.

* * * * *